(12) United States Patent
Benitez et al.

(10) Patent No.: US 8,592,673 B2
(45) Date of Patent: Nov. 26, 2013

(54) ENCLOSED, OFF-AXIS SOLAR CONCENTRATOR

(75) Inventors: Pablo Benitez, Madrid (ES); Robert E. Grip, Rancho Palos Verdes, CA (US); Juan C. Minano, Madrid (ES); Authi A. Narayanan, Thousand Oaks, CA (US); Adam Plesniak, Huntington Beach, CA (US); Joel A. Schwartz, Glendale, CA (US)

(73) Assignee: The Boeing Company, Chicago, IL (US)

( * ) Notice: Subject to any disclaimer, the term of this patent is extended or adjusted under 35 U.S.C. 154(b) by 339 days.

(21) Appl. No.: 12/562,729

(22) Filed: Sep. 18, 2009

(65) Prior Publication Data

US 2010/0275972 A1  Nov. 4, 2010

Related U.S. Application Data

(60) Provisional application No. 61/175,136, filed on May 4, 2009.

(51) Int. Cl.
*H02N 6/00* (2006.01)
*H01L 31/042* (2006.01)

(52) U.S. Cl.
USPC ............................ 136/251; 136/246; 136/259

(58) Field of Classification Search
USPC ................................................ 136/243–265
See application file for complete search history.

(56) References Cited

U.S. PATENT DOCUMENTS

| | | | |
|---|---|---|---|
| 4,150,663 A | | 4/1979 | Sisson |
| 4,223,174 A | | 9/1980 | Moeller |
| 4,350,837 A | * | 9/1982 | Clark ............................ 136/246 |
| 5,180,441 A | | 1/1993 | Cornwall et al. |
| 5,255,666 A | * | 10/1993 | Curchod ........................ 126/569 |
| 5,344,496 A | | 9/1994 | Stern et al. |
| 5,409,550 A | * | 4/1995 | Safir ............................. 136/246 |

(Continued)

FOREIGN PATENT DOCUMENTS

| | | |
|---|---|---|
| DE | 102006009412 | 8/2007 |
| EP | 1835547 | 9/2007 |
| WO | 2007/117136 | 10/2007 |

OTHER PUBLICATIONS

Plesniak, A. et al., "High Performance Concentrating Photovoltaic Module Designs for Utility Scale Power Generation," submitted for the PVSC34 Proceedings, Jun. 7-12, 2009, and SPIE Optics and Photonics, Aug. 2-6, 2009.

(Continued)

*Primary Examiner* — Alexander Kollias
(74) *Attorney, Agent, or Firm* — John A. Lepore

(57) ABSTRACT

A solar concentrator including a housing having a receiving wall, a reflecting wall and at least two end walls, the receiving, reflecting and end walls defining a three-dimensional volume having an inlet, wherein a vertical axis of the housing is generally perpendicular to the inlet, a receiver mounted on the receiving wall of the housing, the receiver including at least one photovoltaic cell, wherein a vertical axis of the receiver is disposed at a non-zero angle relative to the vertical axis of the housing, at least one clip disposed on the reflecting wall, an optical element received within the three-dimensional volume, the optical element including at least one tab, the tab being engaged by the clip to align the optical element with the receiver, and a window received over the inlet to enclose the housing.

10 Claims, 6 Drawing Sheets

(56) References Cited

U.S. PATENT DOCUMENTS

| | | | |
|---|---|---|---|
| 2003/0063888 A1 | 4/2003 | Sahlin et al. | |
| 2003/0075212 A1 | 4/2003 | Chen et al. | |
| 2006/0185713 A1 | 8/2006 | Mook | |
| 2006/0193066 A1 | 8/2006 | Prueitt | |
| 2008/0223443 A1 | 9/2008 | Benitez et al. | |
| 2008/0251113 A1* | 10/2008 | Horne et al. | 136/246 |
| 2008/0308152 A1 | 12/2008 | Grip | |

OTHER PUBLICATIONS

Plesniak, A., Oral Presentation entitled "High Performance Concentrating Photovoltaic Module Designs for Utility Scale Power Generation," PVSC34 Proceedings, Jun. 7-12, 2009, and SPIE Optics and Photonics, Aug. 2-6, 2009.

Plesniak, A., Oral Presentation entitled "Demonstration of High Performance Concentrating Photovoltaic Module Designs for Utility Scale Power Generation," presented at ICEPAG 2009 (Feb. 10-12, 2009).

Plesniak, A., Poster panel entitled, "Demonstration of High Performance Concentrating Photovoltaic Module Designs for Utility Scale Power Generation," presented at ICSC5 (Nov. 16-19, 2008).

"Solar Thermal Propulsion (STP)," website of SRS Technologies, http:web.archive.org/web/20030122205006/http://www.stg.srs.com/atd/STP.htm 2 pages).

DeScioli, D., "Soliant Energy," Soliant Energy, Inc. (24 pages) (2007).

Web page of Soliant Energy, Inc., http://www.soliant-energy.com/products.php (2 pages).

"Products. Amonix 7700 Solar Power Generator," web page of Amonix, http://www.amonix.com/amonix_products.html (3 pages).

Horne, S. et al., "A Solid 500 Sun Compound Concentrator PV Design" (4 pages).

"Sunflower Technology," web page of Energy Innovations, Inc., http://www.energyinnovations.com/sunflower/technology.html (2 pages).

Product literature, "Sunflower. Fully-Integrated, Smart CPV," by Energy Innovations, Inc. (2 pages) (2008).

PCT, International Search Report and Written Opinion, International Application No. PCT/US2010/033211 (Oct. 7, 2011).

\* cited by examiner

US 8,592,673 B2

ENCLOSED, OFF-AXIS SOLAR CONCENTRATOR

PRIORITY

The present patent application claims priority from U.S. Ser. No. 61/175,136 filed on May 4, 2009, the entire contents of which are incorporated herein by reference.

STATEMENT REGARDING FEDERALLY SPONSORED RESEARCH

The invention(s) disclosed herein was/were made with the support of the government of the United States pursuant to contract number DE-FC36-07G017052 awarded by the Department of Energy. Therefore, the government of the United States may have certain rights in the disclosed invention(s).

FIELD

The present patent application relates to concentrating solar power systems and, more particularly, to solar concentrators having a fully enclosed housing, wherein the housing supports a solar cell array in an off-axis configuration.

BACKGROUND

Photovoltaic solar concentrators typically are used to generate electrical power by concentrating sunlight onto photovoltaic devices, thereby collecting sunlight from a large area and concentrating it on a relatively small area of solar cells. Therefore, high efficiency solar cells, such as gallium arsenide-based ("GaAs") solar cells, may be used in place of less efficient (and less expensive) silicon solar cells, thereby producing more energy per unit area at a reduced cost.

Solar concentrators may be configured in various ways and typically include refracting optics, reflecting optics or various combinations thereof. Regardless of the concentrating optics used, excess heat must be removed and the solar cells must be protected from the environment. Therefore, the design process generally requires a compromise between the thermal and/or protective features. For example, prior art systems that utilize Fresnel lenses (refracting optics) require placing the solar cells in the back of an enclosure, which makes it difficult to remove excess heat, requiring a larger heat sink.

Furthermore, efficient operation of solar concentrators requires precise alignment of the optical elements with the solar cells. Indeed, a more precise alignment enables a higher degree of optical concentration, thereby reducing the aggregate solar cell cost. However, prior art solar concentrator designs typically require costly manufacturing steps to achieve precise alignment, while others sacrifice precision, and therefore efficiency, to reduce manufacturing costs.

Accordingly, there is a need for a solar concentrator that quickly and easily aligns the optical elements with the solar cells in an off-axis configuration, while providing the solar cells with the requisite thermal and environmental protections.

SUMMARY

In one aspect, the disclosed solar concentrator may include a housing having a receiving wall, a reflecting wall and at least two end walls, the receiving, reflecting and end walls defining a three-dimensional volume having an inlet, wherein a vertical axis of the housing is generally perpendicular to the inlet, a receiver mounted on the receiving wall of the housing, the receiver including at least one photovoltaic cell, wherein a vertical axis of the receiver is disposed at a non-zero angle relative to the vertical axis of the housing, at least one clip disposed on the reflecting wall, an optical element received within the three-dimensional volume and engaged by the clip to align the optical element with the receiver, and a window received over the inlet to enclose the housing.

In another aspect, the disclosed solar concentrator may include a housing including a receiving wall, a reflecting wall, a lower wall and at least two end walls, the receiving, reflecting, lower and end walls defining a three-dimensional volume having an inlet, wherein a vertical axis of the housing is generally perpendicular to a plane defined by the inlet, a plurality of receivers mounted on the receiving wall of the housing, each receiver defining a vertical axis and including at least one photovoltaic cell, a lens focused on the photovoltaic cell, and a heat sink connected to the photovoltaic cell, wherein the photovoltaic cell and the lens are disposed within the three-dimensional volume and the heat sink is external of the three-dimensional volume, wherein the vertical axis of the receiver is disposed at a non-zero angle relative to the vertical axis of the housing, a plurality of optical elements received within the three-dimensional volume, each optical element including a front tab and a rear tab, a plurality of front clips disposed on the lower wall of the housing, each front clip engaging an associated one of the front tabs, a plurality of rear clips disposed on the reflecting wall of the housing, each rear clip engaging an associated one of the rear tabs, and a window connected to the inlet of the housing to form an enclosed three-dimensional volume.

In another aspect, a method for aligning an optical element with a receiver including at least one photovoltaic cell may include the steps of (1) providing a housing including a receiving wall, a reflecting wall and at least two end walls, the receiving, reflecting and end walls defining a three-dimensional volume having an inlet, wherein a vertical axis of the housing is generally perpendicular to the inlet, (2) positioning at least one clip on the reflecting wall of the housing, (3) mounting the receiver on the receiving wall of the housing, wherein a vertical axis of the receiver is disposed at a non-zero angle relative to the vertical axis of the housing, (4) positioning the optical element within the three-dimensional volume such that the optical element is engaged by the clip and (5) positioning a window over the inlet to enclose the housing.

Other aspects of the disclosed solar concentrator will become apparent from the following description, the accompanying drawings and the appended claims.

DETAILED DESCRIPTION

Figure 1:
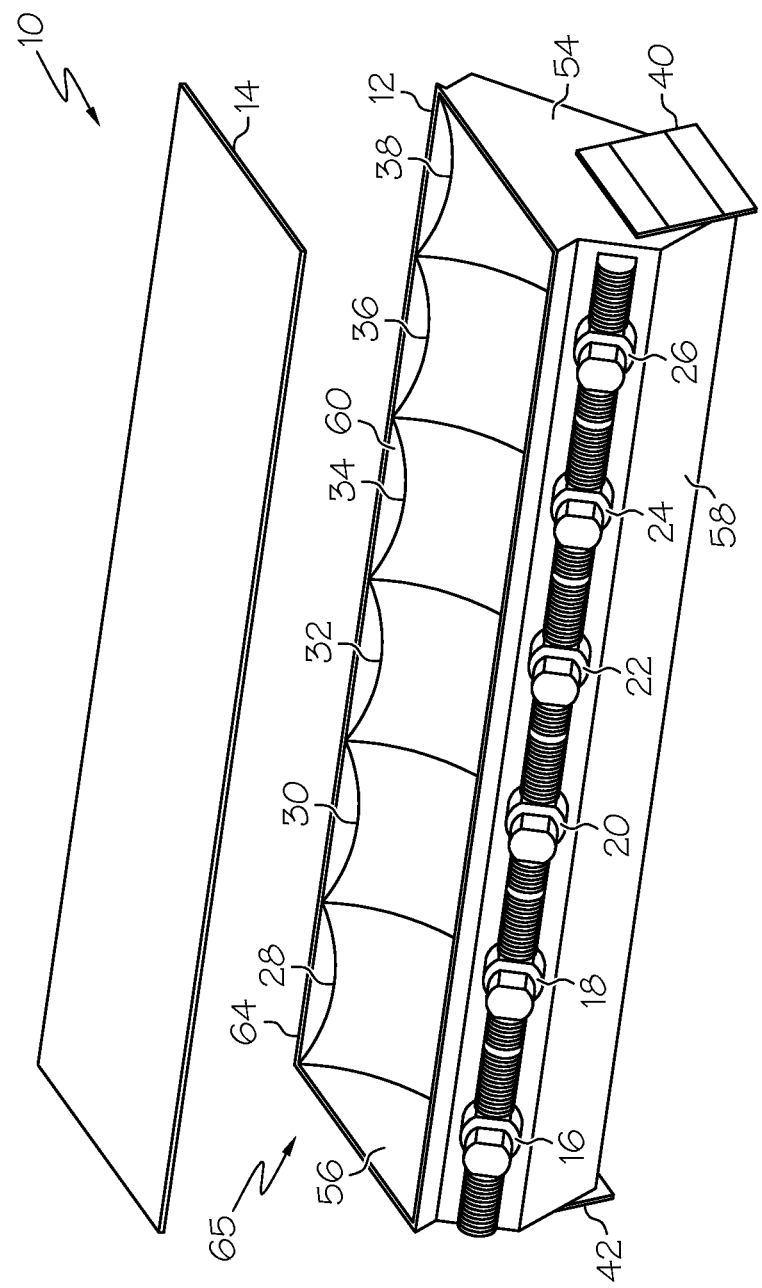
FIG. 1 is a front perspective view, partially exploded, of one aspect of the disclosed solar concentrator.

As shown in FIG. 1, one aspect of the disclosed solar concentrator, generally designated 10, may include a housing 12, a window 14, an array of receivers 16, 18, 20, 22, 24, 26 and an array of optical elements 28, 30, 32, 34, 36, 38. In one aspect, the number of optical elements 28, 30, 32, 34, 36, 38 may correspond to the number of receivers 16, 18, 20, 22, 24, 26. While six optical elements 28, 30, 32, 34, 36, 38 and six receivers 16, 18, 20, 22, 24, 26 are shown in the solar concentrator 10, those skilled in the art will appreciate that solar concentrators may be constructed with various numbers of receivers and optical elements without departing from the scope of the present disclosure.

Optionally, the solar concentrator 10 may include brackets 40, 42 or like devices connected to the housing 12 such that the solar concentrator 10 may be mounted to a solar tracker (not shown). The solar tracker may be configured to rotate the solar concentrator 10 such that the vertical axis A (FIG. 3) of the solar concentrator 10 is aligned with the sun as the sun moves across the sky.

The optical elements 28, 30, 32, 34, 36, 38 may be mirrors or like devices, such as parabolic mirrors, and may be sized and shaped to receive incoming sunlight and focus the incoming sunlight onto the receivers 16, 18, 20, 22, 24, 26. Those skilled in the art will appreciate that the overall size, shape and geometry of the optical elements 28, 30, 32, 34, 36, 38 may depend upon the size and shape of the housing 12, as well as the positioning of the receivers 16, 18, 20, 22, 24, 26 within the housing 12, among other things.

In one particular aspect, one or more of the optical elements 28, 30, 32, 34, 36, 38 may be optical concentrators disclosed in U.S. Patent Pub. No. 2008/0223443 titled "Optical Concentrator, Especially for Solar Photovoltaics" filed by Benitez et al. on Mar. 14, 2008, the entire contents of which are incorporated herein by reference.

Figure 3:
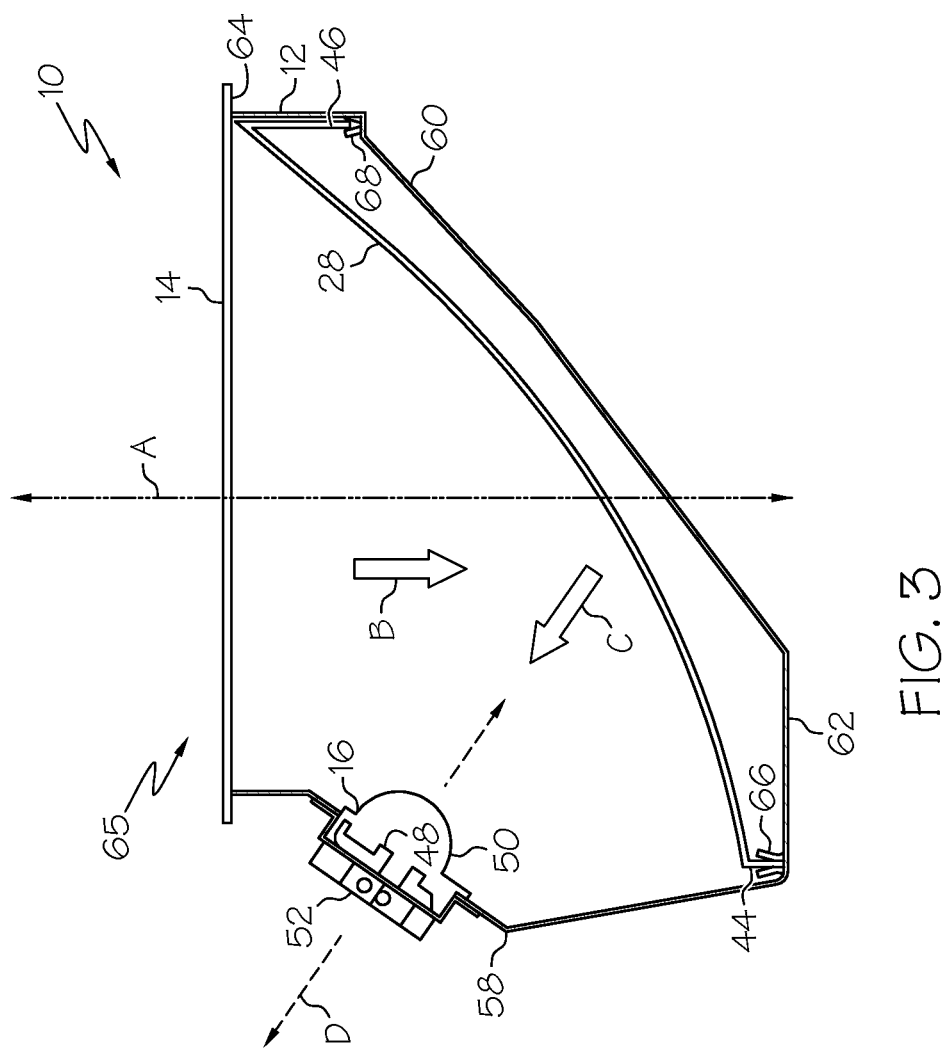
FIG. 3 is a side elevational view, in section, of the solar concentrator of FIG. 2.

Referring to FIG. 3, each optical element 28, 30, 32, 34, 36, 38 may include a front tab 44 and a rear tab 46. The front and rear tabs 44, 46 may be integral with the optical elements 28, 30, 32, 34, 36, 38, or may be connected to the optical elements 28, 30, 32, 34, 36, 38 by, for example, fasteners, adhesives or the like.

Each receiver 16, 18, 20, 22, 24, 26 may include one or more photovoltaic cells for converting harvested light into electrical energy. Referring to FIG. 3, in one particular aspect, each receiver 16, 18, 20, 22, 24, 26 may include one or more photovoltaic cells 48, a lens 50 and a heat sink 52. The photovoltaic cells 48 may be any cells capable of converting light into electrical energy, such as silicon solar cells, GaAs solar cells or the like. The lens 50 may focus harvested light, particularly light directed to the receivers 16, 18, 20, 22, 24, 26 by the optical elements 28, 30, 32, 34, 36, 38, onto the photovoltaic cells 48. The heat sink 52 may be any device capable of dissipating heat from the photovoltaic cells 48, such as a fanned heat sink, a heat pipe or the like.

Referring back to FIG. 1, the window 14 may be a generally planar sheet of transparent or partially transparent material. In one aspect, the window 14 may be formed from glass. In another aspect, the window 14 may be formed from a polymeric material, such as polycarbonate or acrylic. The transparency, flexibility and weatherability of the material (or materials) used to form the window 14 may be selected based upon design considerations.

Figure 2:
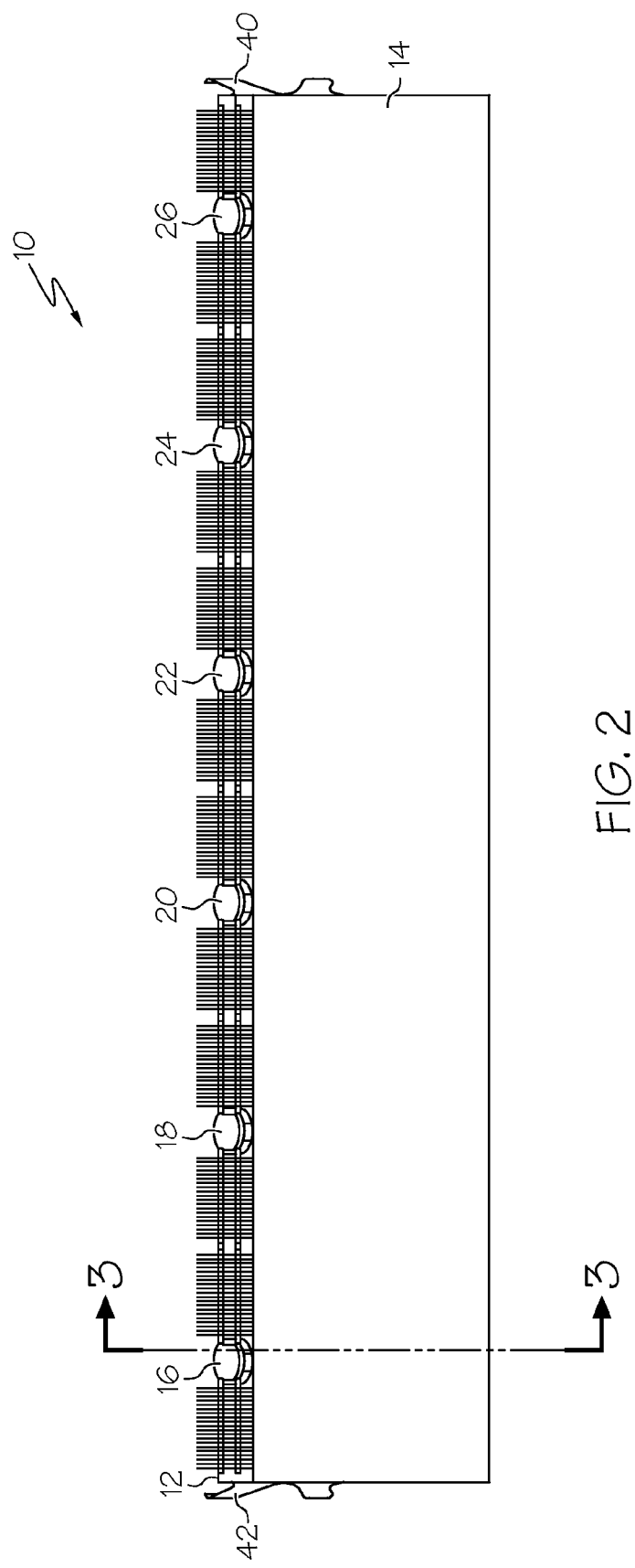
FIG. 2 is a top plan view of the solar concentrator of FIG. 1.

The housing 12 may be a generally rigid, elongated, trough-like structure that houses the receivers 16, 18, 20, 22, 24, 26 and the optical elements 28, 30, 32, 34, 36, 38 therein. However, as shown in FIGS. 1-3, portions of the receivers 16, 18, 20, 22, 24, 26, particularly the heat sink 52, may be external of the housing 12. The housing 12 may be formed as a single piece or as an assembly of multiple pieces. Appropriate materials for forming the housing 12 include steel and moldable fiberglass, though various materials, including combinations of materials, capable of withstanding exposure to the elements may be used.

Referring to FIGS. 1 and 3, the housing 12 may include a first end wall 54, a second end wall 56, a receiving wall 58, a reflecting wall 60 and a lower wall 62. The first end wall 54, the second end wall 56, the receiving wall 58 and the reflecting wall 60 may define an upper lip 64 of the housing 12 that may form an inlet 65 for receiving light into the housing 12. As shown in FIG. 3, the inlet 65 may be generally planar and the vertical axis A of the housing 12 may be generally perpendicular to the plane defined by the inlet 65. The upper lip 64 of the housing 12 may be sized and shaped to closely correspond with the size and shape of the window 14.

Thus, the window 14 may be received over the lip 64 of the housing 12 to fully enclose the housing 12. The window 14 may be secured to the lip 64 of the housing 12 by adhesives, tape (e.g., double-sided tape) or mechanical fasteners. Optionally, a gasket (not shown) may be positioned between the window 14 and the lip 64 to ensure a water-tight seal therebetween.

As shown in FIG. 1, the receivers 16, 18, 20, 22, 24, 26 may be positioned along the receiving wall 58 of the housing 12 such that they are offset from the center of the housing 12. Furthermore, as shown in FIG. 3, the receiving wall 58 may be configured to position the receivers 16, 18, 20, 22, 24, 26 such that a vertical axis D (i.e., an axis parallel with a surface normal) of the receivers 16, 18, 20, 22, 24, 26 is at a non-zero angle relative to the vertical axis A of the housing 12. Therefore, the receivers 16, 18, 20, 22, 24, 26 may not obstruct light (arrow B) entering the housing 12.

In one aspect, the non-zero angle between the vertical axis D of the receivers 16, 18, 20, 22, 24, 26 and the vertical axis A of the housing 12 may be about 20 to about 80 degrees. In another aspect, the non-zero angle between the vertical axis D of the receivers 16, 18, 20, 22, 24, 26 and the vertical axis A of the housing 12 may be about 40 to about 70 degrees. In yet another aspect, the non-zero angle between the vertical axis D of the receivers 16, 18, 20, 22, 24, 26 and the vertical axis A of the housing 12 may be about 50 to about 60 degrees. In yet another aspect, the non-zero angle between the vertical axis D of the receivers 16, 18, 20, 22, 24, 26 and the vertical axis A of the housing 12 may be about 55 degrees.

Still referring to FIG. 3, the optical elements 28, 30, 32, 34, 36, 38 may be positioned along the reflecting wall 60 of the housing 12. Therefore, the optical elements 28, 30, 32, 34, 36, 38 may be positioned to direct incoming light (arrow B) toward the receivers 16, 18, 20, 22, 24, 26 in an off-axis direction, as shown by arrow C.

In one particular aspect, the lower wall 62 of the housing 12 may include front clips 66 for receiving the front tabs 44 of the optical elements 28, 30, 32, 34, 36, 38 and the reflecting wall 60 of the housing 12 may include rear clips 68 for receiving the rear tabs 46 of the optical elements 28, 30, 32, 34, 36, 38. Additional clips may be used to secure the optical elements 28, 30, 32, 34, 36, 38 relative to the housing 12.

Furthermore, while the use of clips and tabs is shown and described, those skilled in the art will appreciate that various mechanical devices (e.g., hooks, straps or belts) or features (e.g., notches or ribs), as well as adhesives, may also be used to engage and secure the optical elements 28, 30, 32, 34, 36, 38 relative to the housing 12 without departing from the scope of the present disclosure. Still furthermore, while the clips 66, 68 shown in FIG. 3 are associated with the housing 12, those skilled in the art will appreciate that the clips 66, 68 may be mounted on the optical elements 28, 30, 32, 34, 36, 38 for engaging the housing 12, particularly a rib, flange, notch or like feature on the housing 12.

In one particular aspect, the front and rear clips 66, 68 may be integral with the housing 12. For example, the front and rear clips 66, 68 may be formed by roll forming or break forming during construction of the housing 12. In another aspect, the front and rear clips 66, 68 may be separate components that have been connected to the housing 12. For example, the front and rear clips 66, 68 may be mechanical clips that have been secured to the housing 12 with fasteners (e.g., screws or rivets).

Accordingly, the front and rear clips 66, 68 positioned within the housing 12 may facilitate precise alignment of the optical elements 28, 30, 32, 34, 36, 38 relative to the receivers 16, 18, 20, 22, 24, 26 in an off-axis configuration, thereby simplifying the installation process. Furthermore, when the window 14 is secured to the housing 12, the housing 12 and window 14 may form an enclosure that protects the optical elements 28, 30, 32, 34, 36, 38 and the delicate components of the receivers 16, 18, 20, 22, 24, 26 from exposure to the environment.

Figure 4:
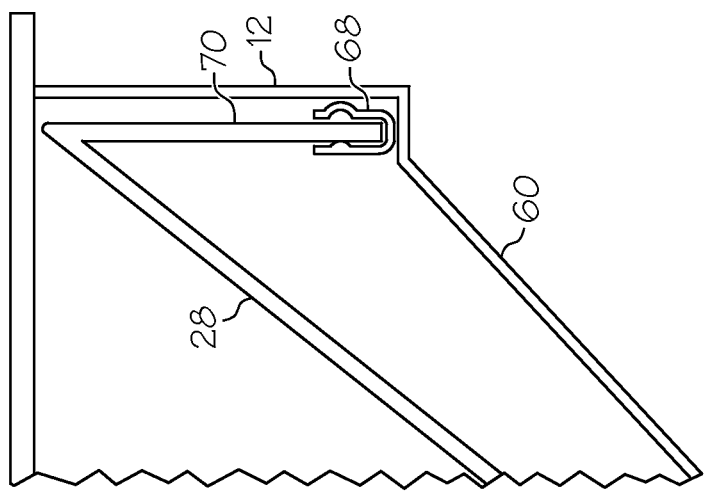
FIG. 4 is side elevational view, in section, of a detailed portion of the solar concentrator of FIG. 3.

Front clip 66 may restrain the position of optical elements 28, 30, 32, 34, 36, 38 at the front location of the optical element in all three directions. However, as shown in FIG. 4, the optical elements 28, 30, 32, 34, 36, 38 may have a foot 70 or like feature, which may be long and slender, that attach to the rear clips 68, which prevent movement in the direction parallel to the sun's rays, but which allow movement in the other two directions normal to the direction parallel to the sun's rays. This advantageous arrangement allows the optical elements 28, 30, 32, 34, 35, 38 to move slightly with respect to the housing 12 due to different coefficients of thermal expansion, while maintaining precise location in the direction which is critical to the optical performance of the system, which is the direction parallel to the sun's rays.

Figure 6:
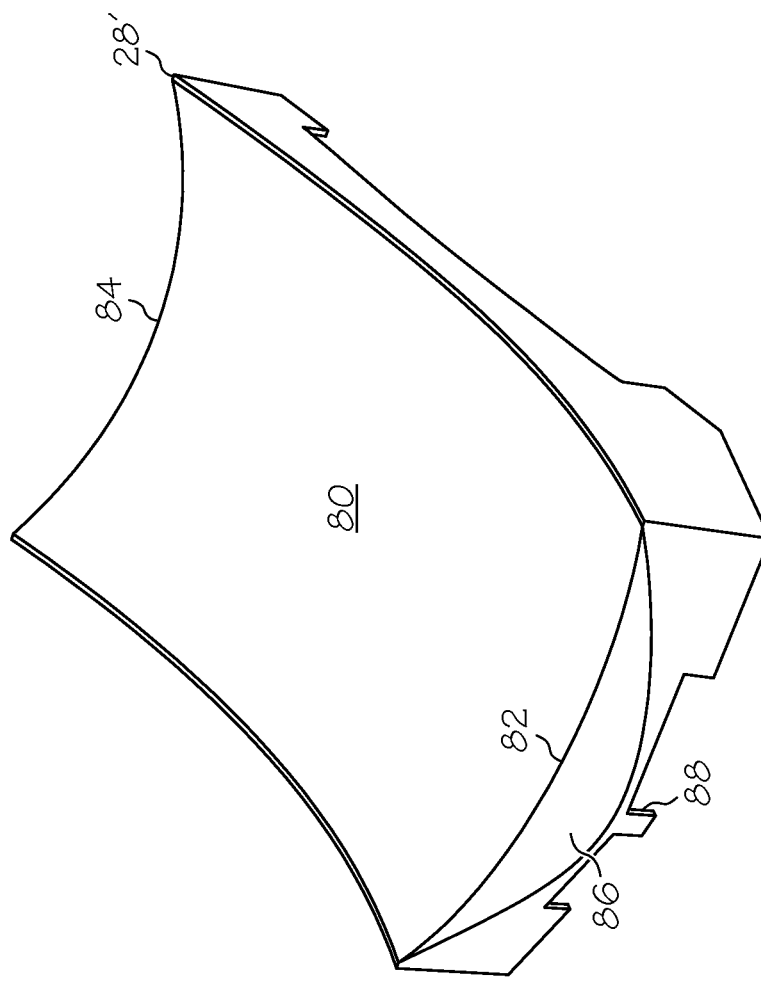
FIG. 6 is a side perspective view of an optical element of the solar concentrator shown in FIG. 5.

Referring to FIG. 6, in one alternative aspect, an optical element 28' may include an optical surface 80 having a forward end 82 and a rear end 84. A protruding portion 86, which may be non-optical, may extend distally from the forward end 82 and may include a front tab 88. Therefore, in one aspect, the front tab 88 may be displaced by a distance X from the forward end 82 of the optical surface 80. In another aspect, the front tab 88 may also be centered relative to the optical surface 80 along the protruding portion 86. Additional front tabs (not shown) may be included along the protruding portion 86 without departing from the scope of the present disclosure.

Figure 5:
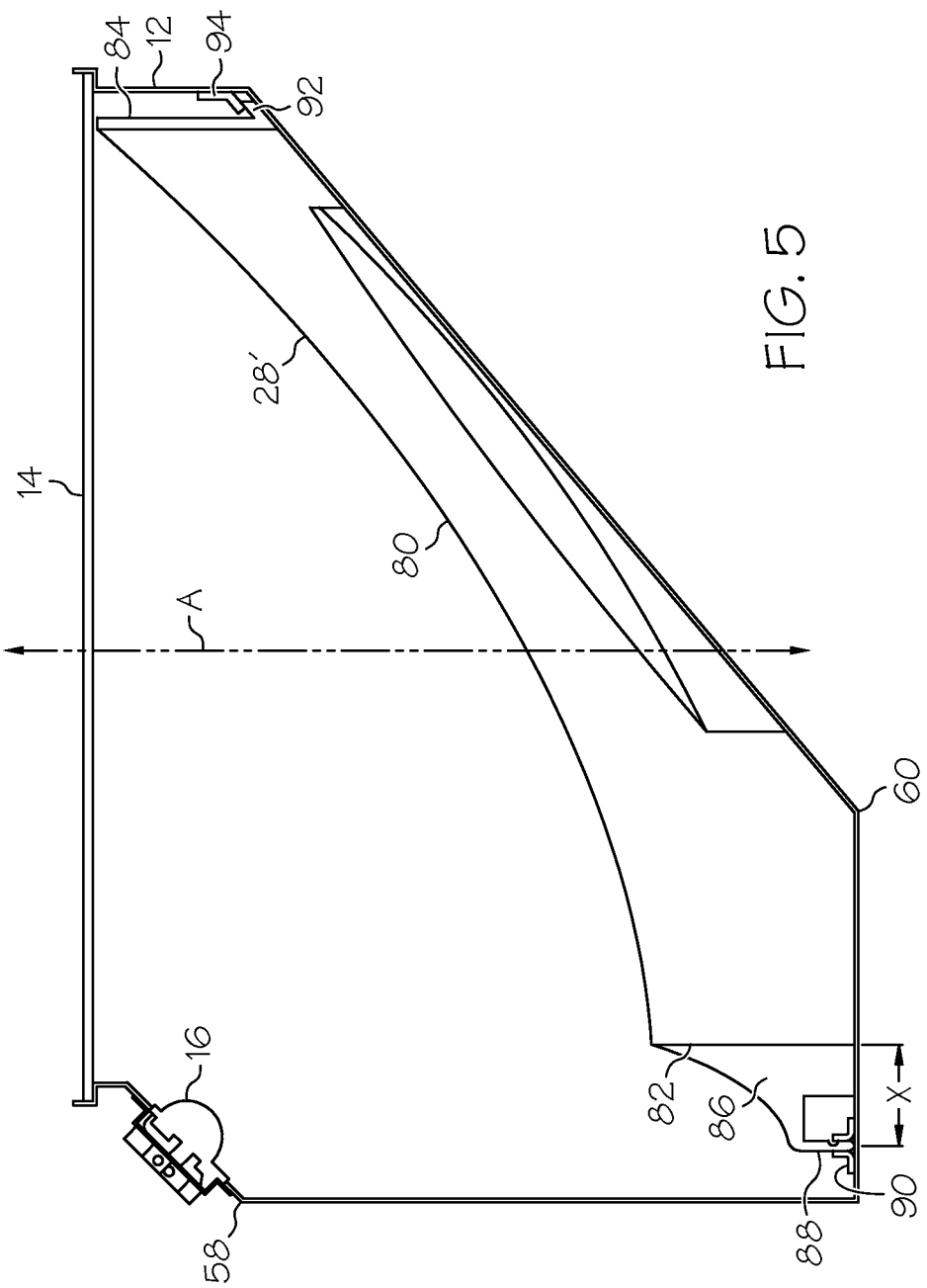
FIG. 5 is a side elevational view, in section, of another aspect of the disclosed solar concentrator.

Referring to FIG. 5, the optical element 28' may be received within the housing 12 such that the front tab 88 is received in a corresponding clip 90 secured to the housing 12, thereby precisely aligning the optical surface 80 of the optical element 28' with the receiver 16 in an off-axis configuration. Additional tabs 92 extending from the rear end 84 of the optical element 28' may engage corresponding clips 94 secured to the housing 12 to further secure the optical element 28' relative to the housing 12. In one particular aspect, the additional tabs 92 may be spring-loaded to absorb stresses between the optical element 28' and the housing 12.

Although various aspects of the disclosed solar concentrator have been shown and described, modifications may occur to those skilled in the art upon reading the specification. The present application includes such modifications and is limited only by the scope of the claims.

What is claimed is:

1. A solar concentrator comprising:
    a housing including a receiving wall, a reflecting wall, a lower wall and at least two end walls, wherein said receiving wall, reflecting wall, lower wall, and end wall define a three-dimensional volume having an inlet, and said housing has an axis perpendicular to a plane defined by said inlet;
    a plurality of receivers mounted on said receiving wall of said housing, wherein each receiver of said plurality of receivers defines an axis and comprises at least one photovoltaic cell, a lens focused on said at least one photovoltaic cell, and a heat sink connected to said at least one photovoltaic cell, wherein said at least one photovoltaic cell and said lens are disposed within said three-dimensional volume, said heat sink is external of said three-dimensional volume, and wherein said axis of each receiver of said plurality of receivers is disposed at a non-zero angle relative to said axis of said housing;
    a plurality of optical elements within said three-dimensional volume, wherein each optical element of said plurality of optical elements comprises a front tab and a rear tab;
    a plurality of front clips disposed on said lower wall of said housing, wherein each front clip of said plurality of front clips engages an associated one of said front tabs;
    a plurality of rear clips disposed on said reflecting wall of said housing, wherein each rear clip of said plurality of rear clips engages an associated one of said rear tabs; and
    a window connected to said inlet of said housing to form an enclosed three-dimensional volume.

2. The solar concentrator of claim 1, wherein said housing and said window enclose said volume.

3. The solar concentrator of claim 1, wherein said plurality of front and rear clips are configured to align said plurality of optical elements with said plurality of receivers.

4. The solar concentrator of claim 1, wherein said optical element is a mirror.

5. The solar concentrator of claim 1, wherein said non-zero angle is about 20 to about 80 degrees.

6. The solar concentrator of claim 1, wherein said non-zero angle is about 55 degrees.

7. The solar concentrator of claim 1, wherein said window is formed from a polymeric material.

8. The solar concentrator of claim 1, wherein said plurality of rear clips are slender to account for differing rates of thermal expansion of said optical elements and said housing.

9. A solar concentrator comprising:
    a housing comprising a receiving wall, a reflecting wall and at least two end walls, said receiving wall, reflecting wall and end wall define a three-dimensional volume having an inlet, said housing having an axis perpendicular to said inlet;
    a receiver mounted on said receiving wall of said housing, said receiver comprising at least one photovoltaic cell, said receiver having an axis disposed at a non-zero angle relative to said axis of said housing;
    at least one clip disposed on said reflecting wall;
    an optical element received within said three-dimensional volume, said optical element comprising a foot engaged by said clip to align said optical element with said receiver; and a window positioned over said inlet to enclose said housing.

10. A method for aligning an optical element with a receiver, said receiver having an axis and including at least one photovoltaic cell, said method comprising the steps of:
- providing an optical element having a foot;
- providing a housing comprising a receiving wall, a reflecting wall and at least two end walls, wherein said receiving wall, reflecting wall and end wall define a three-dimensional volume having an inlet, and said housing has an axis perpendicular to said inlet;
- positioning at least one clip on said reflecting wall of said housing;
- mounting said receiver on said receiving wall of said housing, wherein said axis of said receiver is disposed at a non-zero angle relative to said axis of said housing;
- positioning said optical element within said three-dimensional volume and engaging said foot of said optical element with said at least one clip; and
- positioning a window over said inlet to enclose said housing.

* * * * *

UNITED STATES PATENT AND TRADEMARK OFFICE
CERTIFICATE OF CORRECTION

| | | |
|---|---|---|
| PATENT NO. | : 8,592,673 B2 | Page 1 of 1 |
| APPLICATION NO. | : 12/562729 | |
| DATED | : November 26, 2013 | |
| INVENTOR(S) | : Pablo Benitez et al. | |

It is certified that error appears in the above-identified patent and that said Letters Patent is hereby corrected as shown below:

On the Title Page

Item (73) reads:   Assignee: The Boeing Company, Chicago, IL (US)

It should read:

-- Assignee: The Boeing Company, Chicago, IL (US); Light Prescriptions Innovators, LLC (US) --

Signed and Sealed this
Fifteenth Day of April, 2014

Michelle K. Lee
*Deputy Director of the United States Patent and Trademark Office*